US010468151B2

United States Patent
Alam et al.

(10) Patent No.: US 10,468,151 B2
(45) Date of Patent: *Nov. 5, 2019

(54) HIGH OPTICAL TRANSPARENT TWO-DIMENSIONAL ELECTRONIC CONDUCTING SYSTEM AND PROCESS FOR GENERATING SAME

(71) Applicant: PURDUE RESEARCH FOUNDATION, West Lafayette, IN (US)

(72) Inventors: Muhammad Ashraful Alam, West Lafayette, IN (US); Ruiyi Chen, Hangzhou (CN); Suprem R. Das, West Lafayette, IN (US); David B. Janes, West Lafayette, IN (US); Changwook Jeong, West Lafayette, IN (US); Mark Lundstrom, Lafayette, IN (US)

(73) Assignee: PURDUE RESEARCH FOUNDATION, West Lafayette, IN (US)

(*) Notice: Subject to any disclaimer, the term of this patent is extended or adjusted under 35 U.S.C. 154(b) by 84 days.

This patent is subject to a terminal disclaimer.

(21) Appl. No.: 15/332,938

(22) Filed: Oct. 24, 2016

(65) Prior Publication Data

US 2017/0098486 A1 Apr. 6, 2017

Related U.S. Application Data

(63) Continuation of application No. 13/919,049, filed on Jun. 17, 2013, now abandoned.

(Continued)

(51) Int. Cl.
*H01B 1/02* (2006.01)
*B82Y 40/00* (2011.01)
(Continued)

(52) U.S. Cl.
CPC ............... *H01B 1/02* (2013.01); *B82Y 10/00* (2013.01); *B82Y 40/00* (2013.01); *G02F 1/13439* (2013.01); *H01B 1/04* (2013.01); *H01L 29/1606* (2013.01); *H01L 29/413* (2013.01); *H01L 31/028* (2013.01); *H01L 31/022466* (2013.01);
(Continued)

(58) Field of Classification Search
CPC ........ H01B 1/02; H01B 1/04; Y10T 428/2438
See application file for complete search history.

(56) References Cited

U.S. PATENT DOCUMENTS 7,642,463 B2   1/2010  Guiheen et al.
8,018,563 B2 * 9/2011  Jones .................... B82Y 10/00
                                                     349/139

(Continued)

OTHER PUBLICATIONS

Jeong et al., Nano Lett. 2011, 11, 5020-5025.*

(Continued)

*Primary Examiner* — Vu A Nguyen
(74) *Attorney, Agent, or Firm* — Barnes & Thornburg LLP

(57) ABSTRACT

Hybrid transparent conducting materials are disclosed with combine a polycrystalline film and conductive nanostructures, in which the polycrystalline film is "percolation doped" with the conductive nanostructures. The polycrystalline film preferably is a single atomic layer thickness of polycrystalline graphene, and conductive nanostructures preferably are silver nanowires.

14 Claims, 13 Drawing Sheets

Related U.S. Application Data

(60) Provisional application No. 61/660,520, filed on Jun. 15, 2012.

(51) Int. Cl.

| | | |
|---|---|---|
| *B32B 15/16* | (2006.01) | |
| *G02F 1/1343* | (2006.01) | |
| *H01L 31/0224* | (2006.01) | |
| *H01L 51/44* | (2006.01) | |
| *H01L 31/18* | (2006.01) | |
| *H01B 1/04* | (2006.01) | |
| *B82Y 10/00* | (2011.01) | |
| *H01L 29/16* | (2006.01) | |
| *H01L 29/41* | (2006.01) | |
| *H01L 31/028* | (2006.01) | |

(52) U.S. Cl.
CPC .. *H01L 31/022491* (2013.01); *H01L 31/1864* (2013.01); *H01L 31/1884* (2013.01); *H01L 51/442* (2013.01); *G02F 2202/36* (2013.01); *Y02E 10/547* (2013.01); *Y02E 10/549* (2013.01); *Y10T 428/2438* (2015.01)

(56) References Cited

U.S. PATENT DOCUMENTS

| | | | |
|---|---|---|---|
| 8,363,201 | B2 | 1/2013 | O'Rourke et al. |
| 9,524,806 | B2* | 12/2016 | Jeong ............... H01B 1/02 |
| 2003/0044608 | A1 | 3/2003 | Yoshizawa et al. |
| 2006/0003188 | A1 | 1/2006 | Ohno |
| 2006/0060839 | A1 | 3/2006 | Chandross et al. |
| 2007/0228439 | A1 | 10/2007 | Duan et al. |
| 2007/0284557 | A1 | 12/2007 | Gruner et al. |
| 2008/0259262 | A1 | 10/2008 | Jones |
| 2010/0178417 | A1 | 7/2010 | Connor et al. |
| 2012/0263939 | A1 | 10/2012 | Tao et al. |
| 2012/0327024 | A1 | 12/2012 | Veerasamy |
| 2013/0048339 | A1 | 2/2013 | Tour et al. |
| 2013/0062796 | A1 | 3/2013 | Coughlin |
| 2013/0078449 | A1 | 3/2013 | Naito et al. |
| 2014/0014171 | A1 | 1/2014 | Alam et al. |

OTHER PUBLICATIONS

Zhang et al., J. Phys. Chem. Lett. 2010, 1, 3101.*
Giurgola et al., J. Mater. Sci: Mater Electron (2009) 20:S181-S184.*
Chen, Ruiyi et al., "Co-Percolating Graphene-Wrapped Silver Nanowire Network for High Performance, Highly Stable, Transparent Conducting Electrodes" Advanced Functional Materials, Purdue University, Apr. 25, 2013.
Zhu, Rui et al., "Fused Silver Nanowires with Metal Oxide Nanoparticles and Organic Polymers for Highly Transparent Conductors" ACSNANO. vol. 5, No. 12, pp. 9877-9882 (2011).
Lee, Jinhwan et al., "Room-Temperature Nanosoldering of a Very Long Metal Nanowire Network by Conducting-Polymer-Assisted Joining for a Flexible Touch-Panel Application" Advanced Functional Materials (2013).
Hu, Liangbing et al., "Scalable Coating and Properties of Transparent, Flexible, Silver Nanowire Electrodes" ACSNANO. vol. 4, No. 5, pp. 2955-2963 (2010).
Madaria, Anuj et al., "Uniform, Highly Conductive, and Patterned Transparent Films of a Percolating Silver Nanowire Network on Rigid and Flexible Substrates Using a Dry Transfer Technique" Nano Research. Nano Res (2010) 3: pp. 564-573.
Madaria, Anuj et al., "Large Scale, Highly Conductive and Patterned Transparent Films of Silver Nanowires on Arbitrary Substrates and Their Application in Touch Screens" Nanotechnology, 22. (2011).
Gaynor, Whitney et al., "Smooth Nanowire/Polymer Composite Transparent Electrodes" Advanced Materials 23, pp. 2905-2910 (2011).
Zhu, Yu et al., "Rational Design of Hybrid Graphene Films for High-Performance Transparent Electrodes" ACSNANO. vol. 5, No. 8, pp. 6472-6479 (2011).
De, Sukanta et al., "Silver Nanowire Networks as Flexible, Transparent, Conductive Films: Extremely High DC to Optical Conductivity Ratios" ACSNANO. vol. 3, No. 7, pp. 1767-1774 (2009).
Kholmanov, Iskandar et al., "Reduced Graphene Oxide/Copper Nanowire Hybrid Films as High-Performance Transparent Electrodes" ACSNANO. vol. 7, No. 2, pp. 1811-1816 (2013).
Kholmanov, Iskandar et al., "Improved Electrical Conductivity of Graphene Films Integrated with Metal Nanowires" American Chemical Sociiety, Nano Lett. 2012, 12 pp. 5679-5683.
Moon, In et al., "2D Graphene Oxide Nanosheets as an Adhesive Over-Coating Layer for Flexible Transparent Conductive Electrodes" Scientific Reports (2013).
Chen, Jian et al., "Highly Conductive and Flexible Paper of 1D Silver-Nanowire-Doped Graphene" American Chemical Society. ACS Appl. mater. Interfaces 2013, 5, pp. 1408-1413.
Muller, D. "Grains and grain boundaries in single-layer graphene atomic patchwork quilts", Nature 469, 389-392, Jan. 20, 2011.
Ma, H., "A study of indium tin oxide thin film deposited at low temperature using facing target sputtering system", Surface and Coatings Technology, vol. 153, Issues 2-3, Apr. 15, 2002, pp. 131-137.
Wassei, J., "Graphene, a promising transparent conductor", Materials Today, vol. 13, Issue 3, Mar. 2010, pp. 52-59.
Bae, S., "Roll-to-roll production of 30-inch graphene films for transparent electrodes", Nature Nanotechnology 5, 574-578 (2010).
Thefreedictionary.com, "On", accessed Nov. 6, 2014.
Wu et al., "Electrospun Metal Nanofiber Webs as High-Performance Transparent Electrode", Nano Letters, vol. 10, Aug. 25, 2010, pp. 4242-4248.
Zeng, X, "A New Transparent Conductor: Silver Nanowire Film Buried at the Surface of a Transparent Polymer", Adv. Mater. Aug. 3, 2010, 22, 4484-4488 and Supplemental pp. 1-7.
Dictionary.com, "in", accessed Apr. 7, 2014.
Fan, G., "Graphene/Silicon Nanowire Schottky Junction for Enhanced Light Harvesting", Feb. 16, 2011, ACS Appl. Mater. Interfaces 2011, 3, 721-725.
Kumar et al., "Performance of Carbon Nanotube-Dispersed Thin-Film Transistors", Applied Physics Letters, 2006, pp. 143501-1 to 143501-3, vol. 89.
Bo et al, "Carbon Nanotubes-Semiconductor Networks for Organic Electronics: The Pickup Stick Transistor," Applied Physics Letters, 2005, pp. 182102-1 to 182102-3, vol. 86.
Jeong et al., "Prospects for Nanowire-Doped Polycrystalline Graphene Films for Ultratransparent, Highly Conductive Electrodes", Nano Letters, vol. 11, Oct. 10, 2011, pp. 5020-5025.
Kyrylyuk et al., "Controlling Electrical Percolation in Multicomponent Carbon Nanotube Dispersions", Nature Nanotechnology, vol. 6, Apr. 10, 2011, pp. 364-369.
Lee et al., "Solution-Processed Metal Nanowire Mesh Transparent Electrodes", Nano Letters, vol. 8, Jan. 12, 2008, pp. 689-692.

\* cited by examiner

HIGH OPTICAL TRANSPARENT TWO-DIMENSIONAL ELECTRONIC CONDUCTING SYSTEM AND PROCESS FOR GENERATING SAME

CROSS-REFERENCE TO RELATED APPLICATIONS

This application is a continuation of U.S. patent application Ser. No. 13/919,049, filed Jun. 17, 2013, and claims the benefit of U.S. Provisional Patent Application Ser. No. 61/660,520, filed Jun. 15, 2012. The entire disclosures of both of the foregoing applications are hereby incorporated by reference.

STATEMENT REGARDING FEDERALLY SPONSORED RESEARCH

This invention was made with government support under DE-SC0001085 awarded by the Department of Energy. The government has certain rights in the invention.

BACKGROUND OF THE INVENTION

A. Field of the Invention

The present disclosure relates, generally, to transparent conducting materials ("TCMs") and, more particularly, to hybrid TCMs including a polycrystalline film that is "percolation doped" with conductive nanostructures.

B. Description of the Related Art

Transparent conducting electrodes (TCEs) require high transparency and low sheet resistance for applications in photovoltaics, photodetectors, flat panel displays, touch screen devices and imagers. Indium tin oxide (ITO), or other transparent conductive oxides, have typically been used, and provide a baseline sheet resistance ($R_S$) vs. transparency (T) relationship. However, ITO is relatively expensive (due to limited abundance of indium), brittle, unstable, inflexible. It increases in brittleness with aging and is chemically unstable under acid/base conditions. ITO transparency drops rapidly for wavelengths above 1000 nm, so it has poor transmittance in the near infrared. Furthermore, metallic-ion diffusion from ITO into thin barrier layers may result in parasitic leakage. These and other problems make ITO-based technologies non-ideal for applications such as thin film photovoltaics ("PVs"), flexible electronics, touch-screen displays, light emitting diodes, and the like.

A suitable replacement for ITO is desired therefore. However, since resistivity and transmittance are often fundamentally constrained by the intrinsic properties of a material, developing TCMs with both low sheet resistance (e.g., Rs<10Ω/□) and high transmittance (e.g., T>90%) has been a persistent challenge. Various alternative TCMs to ITO have been explored, including, by way of example, networks of carbon nanotubes ("CNTs") and networks of metal nanowires ("NWs"). In networks of silver nanowires (AgNWs nanonet) and single-wall carbon nanotubes (SW-CNTs nanonet), for NW or CNT densities corresponding to 85-95% transparency (T), conduction is typically dominated by percolation through junctions with relative large tube-tube/NW-NW contact resistance ($R_{NW-NW}$), resulting in a rapid increase in baseline sheet resistance ($R_S$) (kΩ/□-GΩ/□, depending on the NW/NT) as T increases. Networks of only metallic nanowires exhibit sheet resistance of the order of kilo-ohm/□ and more. Approaches involving welding of the nanowires, thermal annealing under pressure, or electroplating decrease $R_S$ by improving $R_{NW-NW}$, but it has been challenging to reduce overall $R_S$ below≈30Ω/□, especially for broadband T at 90%. Moreover, micrometer-sized holes within the network add series resistance to devices that rely on vertical current transport such as LEDs and solar cells. Composite transparent conducting electrodes (TCEs) employing silver NWs with another conducting polymer such as PEDOT:PSS and a combination of $TiO_2$ nanoparticles with PEDOT:PSS have recently been demonstrated with sheet resistances of 12Ω/□ at average T of 86% over wavelengths 350-800 nm and 15Ω/□ at $T_{550\ nm}$ of 83% respectively. The conducting polymer and $TiO_2$ nanoparticle primarily reduce the tube-tube contact resistance.

Other alternative TCMs to ITO have been explored, including chemical vapor deposited ("CVD") polycrystalline graphene ("poly-graphene" or "PG") films, including single layer graphene (SLG) and few-layer graphene (FLG). "Single-crystal" graphene, such as that obtained by exfoliation from highly ordered pyrolytic graphite (HOPG) crystals, exhibits several interesting physical phenomena, including an $_{RS}$ lower than ITO, at a given optical transparency. Single-layer graphene (SLG) or few-layer graphene provide sufficiently high transparency (≈97% per layer) to be a potential replacement for ITO. However, the exfoliated approach yields samples that are too small for practical applications, and large-area synthesis approaches, including chemical vapor deposition (CVD), typically involving growth on copper foil and subsequent transfer to an arbitrary substrate, produces grain sizes typically ranging from a few micrometers to a few tens of micrometers, depending on the specific growth conditions. The resulting films have relatively high sheet resistance due to small grain sizes and high-resistance grain boundaries (HGBs).

While these potential ITO replacements each resolve several practical issues associated with ITO, their respective Rs-T curves are not significantly different from that of ITO (as shown in FIG. 9). To achieve technologically relevant sheet resistance values (e.g., Rs<20Ω/□), the density of a network of CNTs or NWs must significantly exceed the percolation threshold. These high densities of CNTs or NWs, however, reduce the transmittance of such TCMs considerably. Moreover, even with low Rs, vertical current collection in PV cells is compromised by current crowding at the small-area interface between a network of CNTs or NWs and the bulk emitter layer. Meanwhile, experimental data suggests that there is a fundamental limitation to the sheet resistance and transmittance of pure poly-graphene films, making it difficult for poly-graphene to compete successfully with ITO.

It is therefore desired to produce an alternative to ITO that simultaneously exhibits high transparency and a technologically relevant sheet resistance value (e.g., Rs<20Ω/□).

SUMMARY OF THE INVENTION

According to one aspect of the invention, a hybrid transparent conducting material (TCM) comprises a granular polycrystalline film and a layer, on the granular polycrystalline film, comprising a plurality of randomly dispersed conductive nanostructures. The conductive nanostructures are in contact with, or adjacent, the polycrystalline film. The granular polycrystalline film preferably is an atomic monolayer, and the granular polycrystalline film preferably is a polycrystalline graphene film. Most preferably, the polycrystalline film is an atomic monolayer of polycrystalline graphene.

The conductive nanostructures preferably are metallic nanowires, more preferably silver nanowires. In one embodiment, each of the conductive nanostructures has a length greater than 1 µm and a cross-sectional dimension of less than 1 µm. Preferably, average length of the conductive nanostructures is greater than average grain diameter in the granular polycrystalline film, and average distance between the conductive nanostructures is greater than average length of the conductive nanostructures.

In one aspect of the invention, density of the plurality of conductive nanostructures randomly dispersed in the granular polycrystalline film is below a percolation threshold. Preferably, density of the plurality of conductive nanostructures randomly dispersed on the polycrystalline film is at most sixty percent of the percolation threshold. In some embodiments, the conductive nanostructures do not form a percolating network for charge carriers in the polycrystalline film.

In the hybrid TCM of the invention, preferably the granular polycrystalline film and the nanowire layer separately each have a sheet resistance of 20 ohms per square or greater. The hybrid TCM has a sheet resistance below twenty ohms per square. The hybrid TCM of the invention preferably has a transmittance above ninety percent for solar radiation. Preferably the transparent electrode has a sheet resistance below twenty ohms per square and a transmittance above ninety percent for solar radiation.

In the hybrid TCM, the number of conductive nanostructures preferably is less than one half the number of grains in the granular polycrystalline film, more preferably the number of conductive nanostructures is less than one fourth the number of grains in the granular polycrystalline film.

In some embodiments, the transparent electrode may comprise a plurality of stacked layers, where each of the plurality of stacked layers comprises polycrystalline graphene that is percolation doped with metallic nanowires. The transparent electrode may have a sheet resistance below twenty ohms per square and a transmittance above ninety percent for solar radiation.

A photovoltaic cell is provided according to the invention which comprises a transparent electrode comprising polycrystalline graphene that is percolation doped with metallic nanowires, wherein the metallic nanowires do not form a percolation network for charge carriers across the transparent electrode. Because the nanowires by themselves have poor electrical contact they do not provide good percolation transport apart from the combination with the graphene. The metallic nanowires are at sufficiently low density that they do not form a percolation network for charge carriers across the transparent electrode. The photovoltaic cell can comprise a transparent electrode comprising a plurality of stacked layers, with each of the plurality of stacked layers comprising polycrystalline graphene that is percolation doped with metallic nanowires.

A liquid crystal display according to the invention comprises a transparent electrode comprising polycrystalline graphene that is percolation doped with metallic nanowires.

BRIEF DESCRIPTION OF THE DRAWINGS

The foregoing advantages and features of the invention will become apparent upon reference to the following detailed description and the accompanying drawings, of which.

DETAILED DESCRIPTION OF SPECIFIC EMBODIMENTS

Figure 1A:
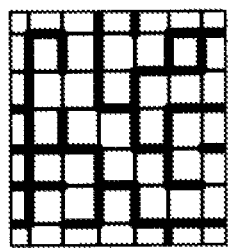
FIG. 1A illustrates one embodiment of a poly-graphene microstructure having uniform square grains ("square").
Figure 1B:
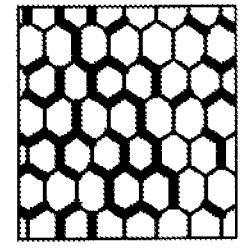
FIG. 1B illustrates one embodiment of a poly-graphene microstructure having uniform hexagonal grains ("hex1").
Figure 1C:
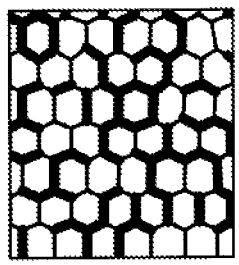
FIG. 1C illustrates one embodiment of a poly-graphene microstructure having perturbed hexagonal grains with Gaussian size distribution ("hex2").
Figure 1D:
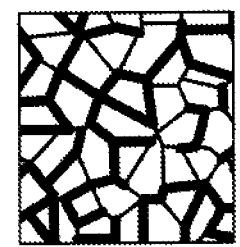
FIG. 1D illustrates one embodiment of a poly-graphene microstructure having random grains with normal size distribution ("rand1").
Figure 1E:
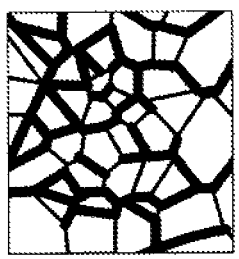
FIG. 1E illustrates one embodiment of a poly-graphene microstructure having random grains with log-normal size distribution ("rand2").
Figure 1F:
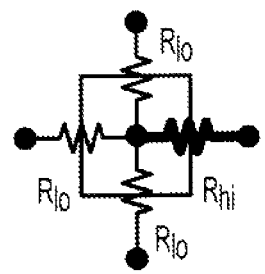
FIG. 1F illustrates a simplified one-node model for the uniform square grains of FIG. 1A.

While the concepts of the present disclosure are susceptible to various modifications and alternative forms, specific exemplary embodiments thereof have been shown by way of example in the drawings and will herein be described in detail. It should be understood, however, that there is no intent to limit the concepts of the present disclosure to the particular forms disclosed, but on the contrary, the intention is to cover all modifications, equivalents, and alternatives consistent with the present disclosure and appended claims.

References in the specification to "one embodiment," "an embodiment," "an illustrative embodiment," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure, or characteristic is described in connection with an embodiment, it is submitted that it is within the knowledge of one skilled in the art to effect such feature, structure, or characteristic in connection with other embodiments whether or not explicitly described. Publications and patent documents mentioned in the present specification are incorporated by reference herein in their entirety. In particular, the article "Co-Percolating Graphene-Wrapped Silver Nanowire Network for High Performance, Highly Stable, Transparent Conducting Electrodes" (Chen et al., *Advanced Functional Materials*, 2013), its Supporting Information, and articles referenced therein all are incorporated in their entirety by reference.

In the drawings, specific arrangements or orderings of schematic elements may be shown for ease of description. However, it should be understood by those skilled in the art that the specific ordering or arrangement of the schematic elements in the drawings is not meant to imply that a particular order or sequence of processing, or separation of processes, is required. Further, the inclusion of a schematic element in a drawing is not meant to imply that such element is required in all embodiments or that the features represented by such element may not be included in or combined with other elements in some embodiments.

The present invention uses a polycrystalline film, preferably a single layer graphene (SLG) film. SLG sheets are produced by chemical vapour deposition, and are a single atom thick layer of graphene which has a structure with grains and grain boundaries (GB). The granular nature of the graphene means that it forms a semi-continuous layer of material. It is weakly conductive.

There is an increasing effort to fundamentally understand the structure of graphene GBs and the impact of GBs on mechanical strength as well as electronic transport. The present inventors have classified GBs broadly into two categories, namely high resistance grain-boundaries (HGBs) and low resistance grain-boundaries (LGBs). Both HGBs and LGBs contribute to the resistance in a SLG film, but it is the HGBs which severely limit the (percolating) electronic transport, as indicated by best reported $R_S$ of $\approx$250-700$\Omega/\square$ (and 2-6 k$\Omega/\square$ for each layer in typical SLG/FLG). In typical CVD graphene grown on copper with average grain size of $\approx$1 µm, the present inventors have recently estimated the percentage of HGBs by using percolation theory through HGBs to interpret the resistance of circular transfer length measurement (CTLM) devices.

A number of groups have proposed methods or reported initial experimental results for improving the transport properties by GB engineering or doping. CVD grown under high methane flow rate provides very uniform coverage over the copper foil and better inter-domain stitching, allowing control of $R_S$. While the inter-grain four-terminal $R_S$ changes between $\approx$3-9 k$\Omega$ as the carrier density is modulated, the intragrain resistance scales up by a constant factor of 1.4 for the same modulation in carrier density, indicating scattering by GBs even for best quality poly-SLG. The most impressive result to date was for large scale CVD graphene by roll-to-roll production, in which the as-grown SLG $R_S$ ($\approx$250$\Omega/\square$) was reduced to $\approx$125$\Omega/\square$ by wet-chemical doping, and four layers were stacked to provide 30$\Omega/\square$ at 90% transparency and at 550 nm ($T_{550\ nm}\approx$90%). However, the chemical doping decreases $R_S$ only by a factor of 2 because while conductivity of individual grain is enhanced, the percolating resistance is still dominated by the HGBs (FIG. 1 B).

In contrast to this approach, the present invention utilizes "percolation-doping" of a polycrystalline film, preferably a single layer graphene film as described above, using conductive nanowires or nanotubes. In this approach, the $R_S$ of graphene network is reduced, not by increasing carrier density, as in chemical doping, but by opening up new conduction channels by bridging the HGBs in the SLG with nanowires or nanotubes.

Figure 5:
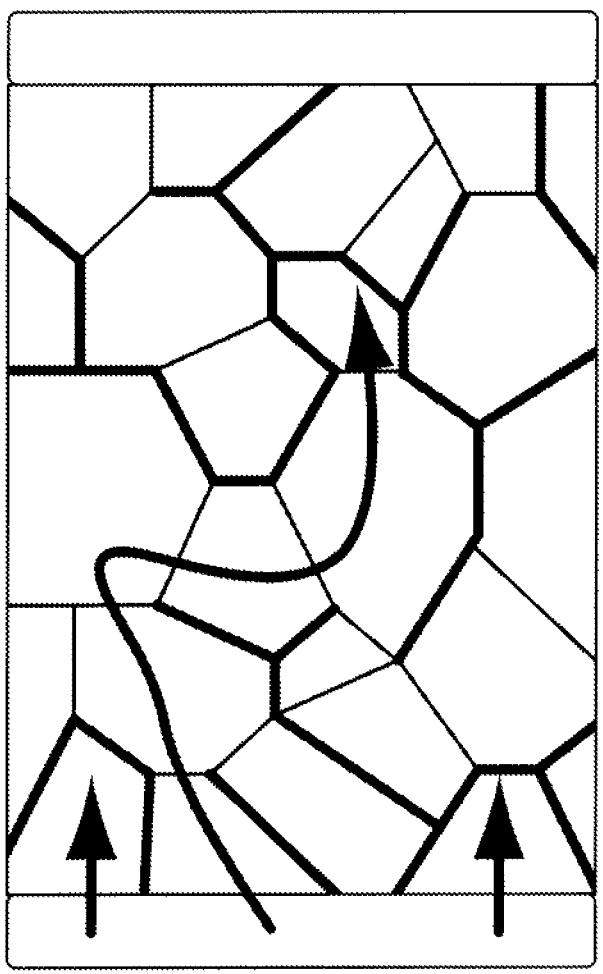
FIG. 5 illustrates the percolation of charge carriers through a poly-graphene film including high-resistance and low-resistance GBs.

Thus, the present disclosure relates to hybrid TCMs including a polycrystalline film (e.g., a poly-graphene film) that is "percolation doped" with conductive nanostructures (e.g., metallic NWs). As noted above, HGBs dominate the resistance in SLG. In hybrid structures with appropriate densities of AgNWs, the NWs bridge the HGBs, providing a percolating transport path for the electrons and therefore lower the sheet resistance. An experimentally calibrated, comprehensive numerical model for electron transport in poly-graphene was used to determine that the high resistivity of pure poly-graphene films reflects an intrinsic percolation bottleneck, in which electrons are periodically trapped in domains formed by high-resistance grain boundaries ("GBs"). FIG. 5 illustrates the percolation of charge carriers through a poly-graphene film including high-resistance and low-resistance GBs, while FIG. 6 illustrates the percolation of charge carriers through a poly-graphene film including high-resistance and low-resistance GBs where the poly-graphene film has been "percolation doped" with metallic nanowires.

Figure 6:
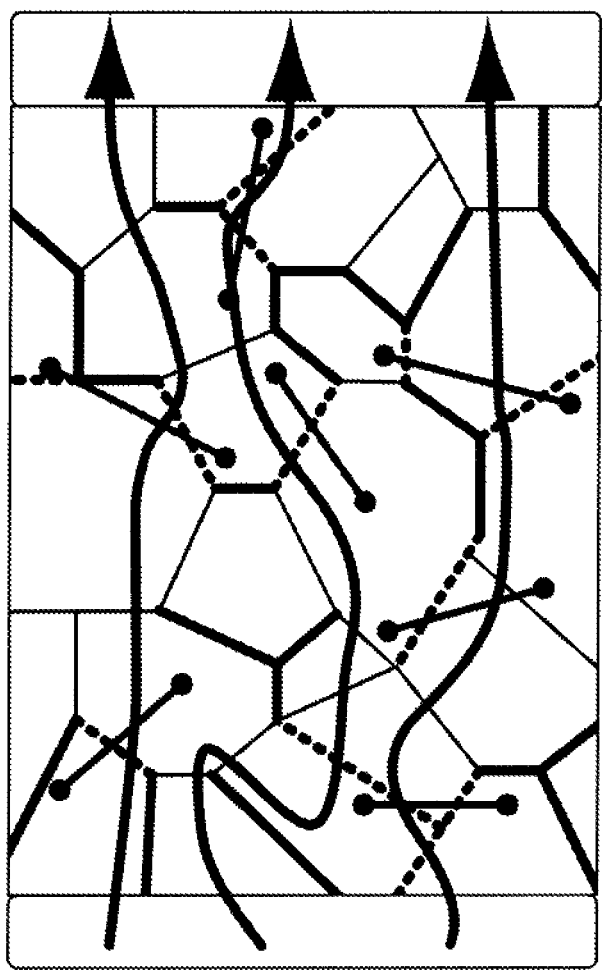
FIG. 6 illustrates the percolation of charge carriers through a poly-graphene film including high-resistance and low-resistance GBs. where the poly-graphene film has been "percolation doped" with metallic nanowires.

As shown in FIG. 6, the density of the NWs may be below a percolation threshold, so that the NWs themselves do not form a percolating network across the hybrid TCM between electrical contacts. If the average length of the NWs is larger than the average grain size, $<L_{grain}>$, the NWs will cross the GBs of the poly-graphene with probability approaching one. Where a NW intersects a high-resistance GB, that GB will no longer inhibit current conduction (as illustrated by the dashed lines in FIG. 6), so that the effective percentage of high-resistance GBs, $P_{GB}$, is reduced. Given the exponential dependence of conductivity on $P_{GB}$ (see FIG. 4), even a modest percolation-doping with NWs can dramatically decrease the sheet resistance $R_S$ of poly-graphene films. Thus, the density of the nanowires can be used to control the properties of the hybrid material.

As used in the present disclosure, "percolation doping" refers to the inclusion and/or addition of conductive nanostructures in a polycrystalline film, at a density below a percolation threshold, to improve conductivity by creating conducting pathways that bridge high-resistance GBs in the polycrystalline film. The continuity of the polycrystalline film in such a hybrid TCM ensures vertical current collection free from current crowding, while the relatively low density of conductive nanostructures ensures that the high transmittance of the polycrystalline film is not compromised. As further described below, a hybrid TCM including a poly-crystalline film that is percolation doped with conductive nanostructures simultaneously achieves both low sheet resistance (e.g., Rs<20$\Omega/\square$) and high transmittance (e.g., T>90%). Its performance with respect to these properties is comparable to, or better than, ITO, while it is free of the negative attributes of ITO discussed herein. Although the illustrative embodiments described below are described primarily with reference to a poly-graphene film, it is contemplated that any polycrystalline material may similarly benefit from percolation doping with conductive nanostructures. Examples of other polycrystalline films for forming transparent conducting electrodes include transparent conductive oxides (TCO) which are doped oxides of tin, zinc, cadmium and their alloys, such as ITO. However, the utility of percolation doping in a two-dimensional (2D) polycrystalline material by a one-dimensional (1D) random nanostructure extends beyond TCE. Any large scale, polycrystalline 2D material such as $MoS_2$, silicene, germanane etc can benefit from the teachings according to the present invention.

Graphene-silver nanowires hybrid transparent conducting electrodes are formed as follows. Silver nanowires of number density $D_i$ ($D_i$ varies roughly from $2.0 \times 10^6$ to $4.8 \times 10^6$), diameters 70 nm-110 nm, and length of 20-60 μm were uniformly dispersed on to RCA cleaned quartz or transparent and flexible substrate (PET) to form a nano-net structure. The structure is dried for 12 hours in nitrogen ambient maintained within a glove box. Surfactants and residue on substrate/nanonet surface are cleaned by dipping in methanol for 30 minutes and dried by blowing with dry nitrogen gas. The sample is then annealed at 180° C. for 1 hour in forming gas with 40 sccm flow rate (For samples with a bendable substrate (PET), the process step are performed at 150° C. temperature). Independently, in another process, AZ1518 photoresist is spin-coated on one side of a copper foil containing graphene on its surface. The graphene on the other side of the copper foil is plasma etched for 10 seconds, using oxygen plasma at 100 Watt power, 50 mtorr $O_2$ pressure, and 50 sccm flow rate. Then the copper foil is etched in copper etchant to get a graphene/AZ1518 stack floating on the etchant.

The single layer graphene sheet protected with photoresist (AZ1518) layer is wet transferred on to a quartz/nano-net or PET/nano-net substrate, cleaned twice using DI water, cleaned twice in dilute hydrochloric acid (5% by volume in DI) for 15 minutes, and then cleaned twice again in DI. It then is dried for 12 hours, preferably in nitrogen glove box. After drying, the photoresist is stripped in hot acetone at 90° C. for 3 hours, followed by an acetone rinse and then a methanol rinse, and is blown dry gently with nitrogen.

The quartz/AgNW-nanonet/graphene stack is annealed in forming gas at 300° C. for 1 hour with 40 sccm flow rate, then cooled to 50° C. or below in forming gas before removing from furnace. For PET/AgNW-nanonet/graphene hybrid bendable TCE, the annealing temperature is 150° C. (all other parameters remaining the same).

For CTLM device fabrication, a standard photolithography process, development, metallization and lift-off is used. The quartz/AgNW-nanonet/graphene is dipped in chlorobenzene solution for 5 minutes before the photolithography. No chlorobenzene treatment is used for PET/AgNW-nanonet/graphene. Contact electrodes for electrical measurements: Ti (1 nm)/Pd (30 nm)/Au (20 nm) are e-beam evaporated with a rate of 0.7 Å/sec, 1 Å/sec, and 1 Å/sec respectively. Finally, after the lift-off, the devices are cleaned in hot acetone at 90° C. for 2 hours, rinsed in acetone and methanol and blow dried with nitrogen.

The hybrid Graphene-AgNW TCE shows excellent chemical and optical stability over four months of time (examined after four months of storage in glove box and couple of days exposure to air before the measurements), and has a stabilized sheet resistance of 13Ω/ with 88% optical transmittance at 550 nm wavelength. The hybrid Graphene-AgNW TCE on PET substrate shows excellent mechanical stability over bending. Pure graphene resistance changed by ~20% with bending radius ranging from 8.3 mm to 14.6 mm, while hybrid graphene-AgNW changed its resistance much less.

Figure 2A:
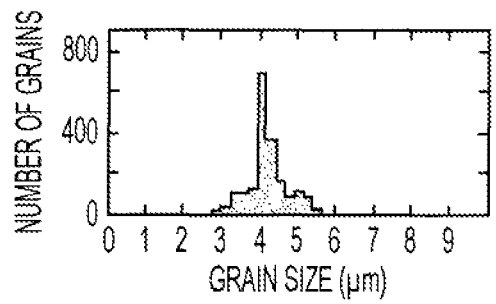
FIG. 2A illustrates a grain size distribution for the poly-graphene microstructures of FIG. 1C.
Figure 2B:
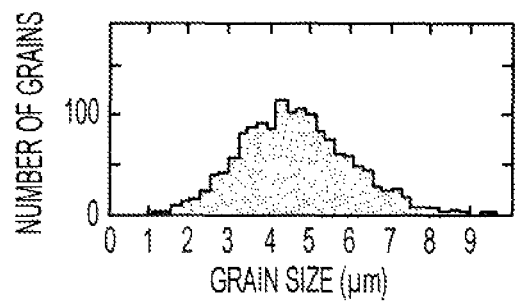
FIG. 2B illustrates a grain size distribution for the poly-graphene microstructure of FIG. 1D
Figure 2C:
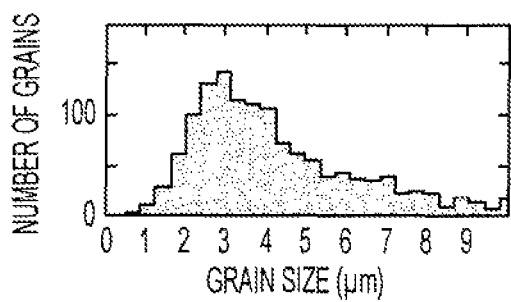
FIG. 2C illustrates a grain size distribution for the poly-graphene microstructure 1E.

To better understand the resistivity of poly-graphene, a process model was used to produce representative structures, an electrical model was used to compute sheet resistances, and an optical model was used to compute transmittances. First, polycrystalline graphene samples were synthetically generated using Voronoi tessellation. In this algorithm, input parameters (e.g., the pattern and number of seed sites) were used to control statistical features of the resulting Voronoi cells (e.g., shape, size. statistical distributions, etc.). This approach allowed the generation of a wide variety of film morphologies characteristic of various deposition conditions and captured the universal features of carrier transport in poly-graphene films, independent of the details of film deposition. Five types of microstructures with increasing complexity were used to represent grain-size distributions in poly-graphene films: uniform square grains as a reference structure ("square," illustrated in FIG. 1A), uniform hexagonal grains to approximate poly-graphene films produced by a seeded growth method ("hex1" illustrated in FIG. 1B), perturbed hexagonal grains with Gaussian size distribution typical of poly-graphene films produced by a seeded growth method ("hex2" illustrated in FIG. 1C), random grains with normal size distribution to approximate CVD poly-graphene films ("rand1" illustrated in FIG. 1D), and random grains with log-normal size distribution typical of CVD poly-graphene ("rand2" illustrated in FIG. 1E). Corresponding grain size distributions for the "hex2", "rand1" and "rand2" microstructures are illustrated in FIG. 2A, FIG. 2B, and FIG. 2C, respectively. In each of the five types of microstructures, the average grain size (i.e., the average grain diameter. $<L_{grain}>$ was ~5 μm (consistent with reported values). Several hundred samples of the foregoing microstructures were synthetically generated for statistical study of the transport characteristics of poly-graphene films.

Two important electrical parameters for polycrystalline films are the resistances of the grains (i.e., inter-grain resistances) and of the GBs intra-grain resistances). In poly-graphene, it is experimentally observed that ratio between these resistances typically range from ~1 to ~30. Although the GBs may exhibit a distribution of resistances (as a function of misorientation between neighboring grains), for simplicity, each GB is classified as either a high-resistance GB or a low-resistance GB in the present disclosure. In the illustrative microstructures shown in FIG. 1A-E, approximately half of the GBs are classified as high-resistance GBs (lines of heavier weight), and approximately half of the GBs are classified as low-resistance GBs (lines of lighter weight). In other words, the percentage of high-resistance GBs, $P_{GB}$, is about 50% in these microstructures.

A drift-diffusion formulation may be used to describe electronic transport through the microstructures described above: $J=(\sigma \cdot \nabla(F_n/q)$, where J is the current density in A/m, (σ is the sheet conductivity, and $F_n$ is the electrochemical potential). This drift-diffusion formulation is appropriate because the average grain size (~5 μm) is much larger than the typical mean-free path (hundreds of nanometers). Assuming charge current is conserved (i.e., no recombination-generation), $\nabla \cdot J=0$ may be solved.

Within the bulk of a poly-graphene grain, $\sigma=\sigma_0$. The theoretical lower limit of sheet resistance is 30Ω/□, which occurs when only acoustic deformation potential scattering is present. A low-resistance GB may characterized as being perfectly transparent to charge carriers (i.e., $\sigma_{GB}^{(lo)} \equiv \sigma_0$). A high-resistance GB may be characterized by transport energy gap ($E_G$) below which charge carriers are perfectly reflected, i.e., $\sigma_{GB}^{(hi)} < \sigma^0$. With these three conductivities, $\sigma_0$, $\sigma_{GB}^{lo}$, $\sigma_{GB}^{hi}$, the transport problem is fully defined. The foregoing model of high and low resistance GBs leads to a maze-like morphology landscape through which a charge carrier injected from one contact travels to the other contact (as further described below with reference to FIG. 5), thereby transforming electronic transport in poly-graphene into a percolation problem.

For each of the microstructures discussed above, the finite difference method ("FDM") was used to calculate electronic transport properties (with each grain having about 200 nodes). The input parameters used for the FDM calculations were the sheet resistance within the grains ($R_{lo} \approx 30\Omega/\square$) and the sheet resistance across high-resistance GBs ($R_{hi} \approx 63 R_{lo}$). The FDM results were compared to a simple "one-node model" in which each grain was represented by only one node. In the one node model, each grain is represented by a single "super-node" of a network. These grains are separated from each other by the intergrain sheet resistances, which could be either high-resistance grain boundaries ($R_{HGB}$), or low-resistance grain boundaries ($R_{LGB}$). A single AgNW bridges multiple grains. For the illustrative microstructure of FIG. 1A, the one-node model is shown schematically in FIG. 1F, where the sheet resistance across each low-resistance GB and the sheet resistance across each high-resistance GB are denoted as $R_{lo}$ and $R_{hi}$, respectively. The high-resistance and low-resistance GBs in this one-node model can be easily measured. See also Figure S6 in the Supporting Information of Chen et al.

Figure 3:
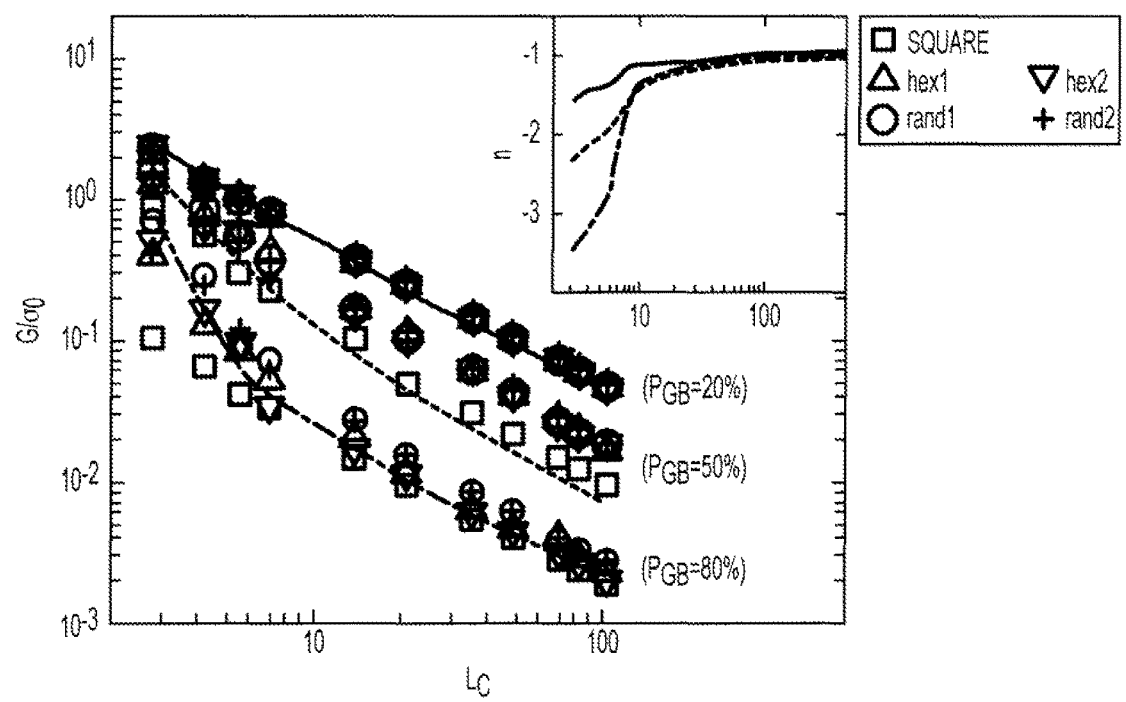
FIG. 3 is a graph of normalized sheet conductance for the poly-graphene microstructures of FIGS. 1A-E as a function of sample length, for three different percentages of high-resistance grain boundaries ("GBs").

The normalized sheet conductance, $G/\sigma_0$, for each of the microstructures discussed above is plotted in FIG. 3 as a function of the sample length, $L_c$, for three different percentages of high-resistance GBs ($P_{GB}$=20%, 50%, and 80%). The sample width was fixed at seven times the average grain size, after which the width dependence of the electronic transport properties disappears (as one of ordinary skill would expect for large area films). The inset of FIG. 3 shows the dependence of the conductance exponent, n, on the sample length, i.e., $G \propto L_c^n$, for the three different percentages of high-resistance GBs. If the sample length is smaller than about ten times the average grain size, the conductance exponent becomes significantly larger than −1.0, indicating a nonlinear dependence on sample length. Thus, as compared to a longer sample, there is a higher probability in a shorter sample that low-resistance GBs and grains form a percolation path (i.e., a continuous network) between the electrical contacts. For large area poly-graphene (e.g., square meters, as may be used in PV applications), however, the conductance exponent approaches −1.0 with increasing length, regardless of the percentage of high-resistance GBs. As can be seen in FIG. 3, the grain shape and grain size distributions have little effect on the conductance of poly-graphene. Rather, it is the average size of the grains, $<L_{grain}>$, and the percentage of high-resistance GBs, $P_{GB}$, that dictate the overall electronic transport properties of poly-graphene.

Figure 4:
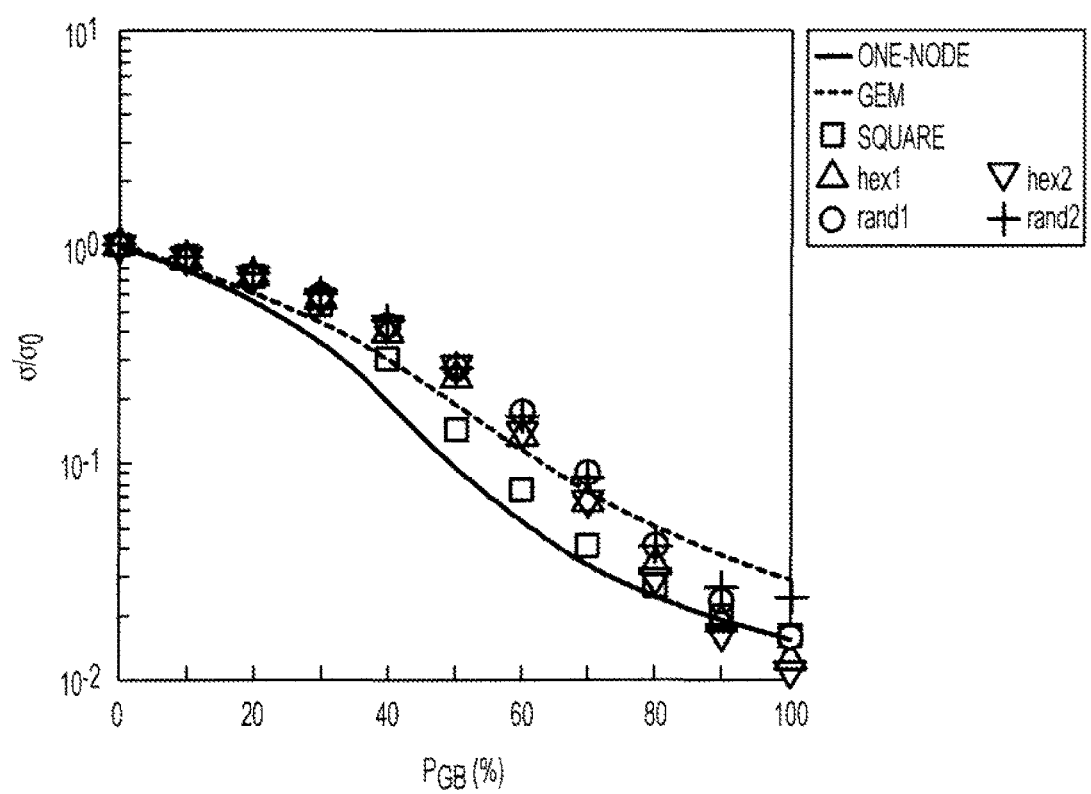
FIG. 4 is a graph of normalized conductivity for the poly-graphene microstructures of FIG. 1A-E as a function of the percentage of high-resistance GBs for a relatively long sample.

The dependence of the normalized conductivity, $\sigma/\sigma_0$, on the percentage of high-resistance GBs, $P_{GB}$, for a relatively long sample (e.g., $L_c \approx 100 \times <L_{grain}>$) is plotted in FIG. 4. As can be seen in FIG. 4, even small increases in the percentage of high-resistance GBs may result in dramatic suppressions of conductivity. This result may be understood with reference to FIG. 5, which interprets the resistance of a poly-graphene film as a percolation problem defined by high-resistance GBs (lines of heavier weight) and low-resistance GBs (lines of lighter weight). The percolation threshold for a Voronoi tessellation is 0.667-0.68, while the percolation threshold of a hexagonal lattice is 0.6527. Therefore, regardless of the specific form of the GB distribution, when the percentage of high-resistance GB approaches ~0.66 (i.e., $P_{GB} \approx 66\%$), charge carriers traveling through a poly-graphene film between a pair of electrical contacts must cross one or more high-resistance GBs (the movement of the charge carriers is indicated by arrows in FIG. 5). This percolation bottleneck suppresses the conductivity of the poly-graphene film exponentially.

To confirm this percolation analysis quantitatively, the numerical results from the FDM simulation discussed above were interpreted using the generalized effective media ("GEM") theory. The GEM equation is given by:

$$\frac{f_{GB}\left(\sigma_{GB}^{\frac{1}{t}} - \sigma^{\frac{1}{t}}\right)}{\sigma_{GB}^{\frac{1}{t}} + A\sigma^{\frac{1}{t}}} + \frac{(1-f_{GB})\left(\sigma_0^{\frac{1}{t}} - \sigma^{\frac{1}{t}}\right)}{\sigma_0^{\frac{1}{t}} + A\sigma^{\frac{1}{t}}} = 0 \quad (I)$$

where $f_{GB}$ is area fraction of grain boundaries, $\sigma_{0(GB)}$ is the conductivity of the grain (GB), t is a characteristic exponent defined in a $\sigma \propto (1-f_{GB}/f_{C,GB})^t$ (with $f_{C,GB}$ being the threshold area fraction of GBs) and the constant A is $A=f_{C,GB}/(1-f_{C,GB})$.

When $\sigma_0/\sigma_{GB}=\infty$, Equation (I) may be reduced to a percolation equation:

$$\sigma \propto \left(1 - \frac{f_{GB}}{f_{C,GB}}\right)^t$$

With t=1 and A=2, Equation (I) may also be reduced to Bruggeman's symmetric effective medium equation. To fit our simulation results, two parameters were determined: t and $f_{C,GB}$. The bounds for the critical exponent were set as 1.05 to 1.37 (typical numbers for two-dimensional bond percolation), while $f_{C,GB}$ was adjusted to fit the data. The relationship of $f_{C,GB}$ to $P_{C,GB}$ is $$P_{C,GB} = f_{C,GB}(P_{GB}^{100\%}/f_{GB}^{100\%})$$

where
  $f_{GB}^{100\%} \sim 12.6\%$ is the area fraction of GBs when $P_{GB}$=100% (in the FDM simulation).

The intensity of D bands in the spectroscopic Raman mapping of poly-graphene grains and GBs showed $f_{GB}^{100\%} \sim 12.6\%$. As shown by dashed line in FIG. 4, the numerical results for poly-graphene electronic transport are well-reproduced by the GEM equation when t=1.05 and $f_{C,GB}=8.4\pm0.2$, corresponding to a percolation threshold of $P_{GB}$, $P_{C,GB}=67\pm1.6\%$.

Based on the foregoing analysis, the sheet-resistance of poly-graphene may be reduced either by increasing grain-size or by reducing the number of high-resistance GBs. To decrease the influence of high resistance GBs, a hybrid TCM may comprise a polycrystalline film that is percolation doped with conductive nanostructures, as shown in FIG. 6. The conductive nanostructures used to percolation dope the polycrystalline film may each have a cross-sectional dimension of less than 1 μm. In the illustrative embodiment of FIG. 6, a poly-graphene film includes a sparse random dispersion of metallic NWs. These metallic NWs may comprise any suitable material including, but not limited to, gold (Au), copper (Cu), aluminum (Al), silver (Ag), and combinations thereof. While the remainder of the disclosure will refer to an illustrative embodiment using metallic NWs, it is also contemplated that other conductive nanostructures may be used for percolation doping the polycrystalline film, including, but not limited to, CNTs and non-metallic NWs.

As one illustrative example, a poly-graphene film with an average grain-size of 5 μm may be percolation doped with a random dispersion of Ag NWs having a 100 nm diameter and an average length of 8 μm. With these dimensions, each of the Ag NWs will bridge GBs in the poly-graphene film with a probability approaching 1. The NW density ($\rho_{NW}$) may be varied between 0 to 100%, where 100% is defined as the density for which every other grain of the poly-graphene, on average, contains a NW (i.e., a NW density just below the percolation threshold). For the illustrative example where a poly-graphene film with an average grain-size of 5 μm is percolation doped with NWs having an average length of 8 μm, 100% density may correspond to the average distance between NWs being ~8-10 μm.

Figure 7:
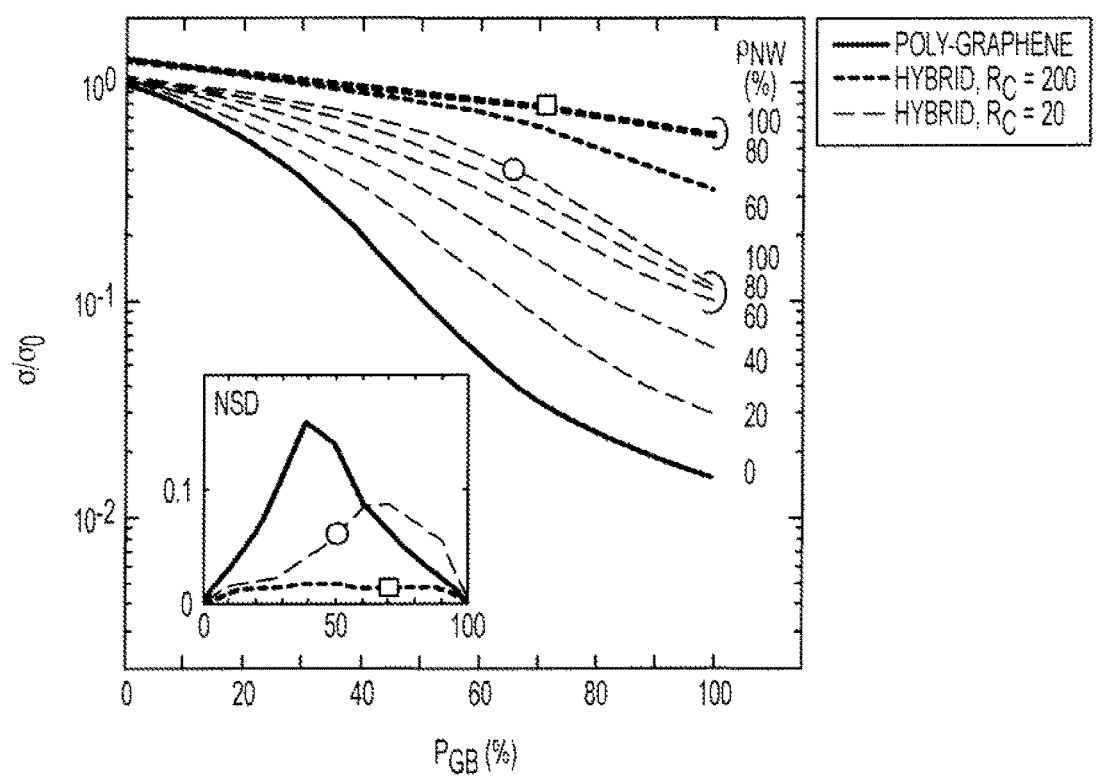
FIG. 7 is a graph of normalized conductivity for pure poly-graphene and for two hybrid TCMs as a function of the percentage of high-resistance GBs, for different NW densities.

The contact resistance, $R_C$, between metal and graphene is ~200 Ω·μm. The theoretical lower limit of $R_C \approx 20$ Ω·μm is obtained by assuming that the work function, W, difference between Ag and graphene is about 0.3 eV ($W_{graphene}$=4.4~4.6 eV, $W_{Ag}$=4.7~4.9 eV). The poly-graphene conductivities discussed above remain unchanged. Using these values, a two dimensional simulation of the illustrative embodiment of a poly-graphene film percolation doped with Ag NWs was used to calculate the overall conductivity σ, of the hybrid TCM, with the results summarized in FIG. 7. The solid line in FIG. 7 represents the normalized conductivity of pure poly-graphene (without percolation-doping by NWs. i.e., $\rho_{NW}$=0%), similar to FIG. 4. As the density of the Ag NWs is increased toward the percolation threshold (i.e., $\rho_{NW}$=100%), the normalized conductivity increases dramatically. Even with a sparse NW density of only 60% (i.e., about one NW for every four grains of poly-graphene) and relatively poor contact resistance (e.g., $R_C \approx 200$ Ω·μm), the sheet conductance, σ, begins to approach that of pure single crystalline graphene (Rs≈30Ω/□). The conductivity improves even further for lower contact resistance (e.g., $R_C \approx 20$ Ω·μm), as the quasi-percolating NWs begin to carry a larger fraction of the current between the electrical contacts of the hybrid TCM and a reduces below 30Ω/□. Given the sheet resistance, $R_S$, of a monolayer of hybrid TCM (i.e., a poly-graphene film percolation doped with NWs), the sheet resistance of 2 or 3 layers of the hybrid TCM is obtained by $R_S^{(n)}=R_S^{(1)}/n$, where n is the number of layers. As such, a stack comprising 2-3 layers of the hybrid TCM described herein offers sheet resistance, Rs, which approaches 10Ω/□, as illustrated in FIG. 9.

Figure 8A:
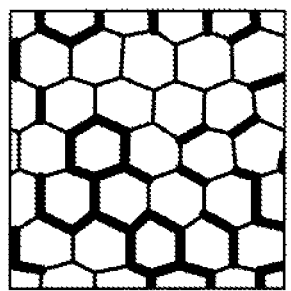
FIG. 8A illustrates one embodiment of a poly-graphene sample having perturbed hexagonal grains.
Figure 8B:
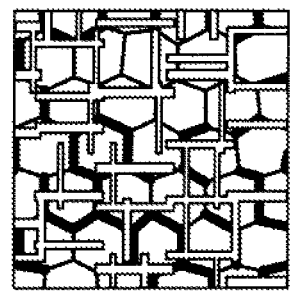
FIG. 8B illustrates a poly-graphene sample percolation doped with metallic NWs.
Figure 8C:
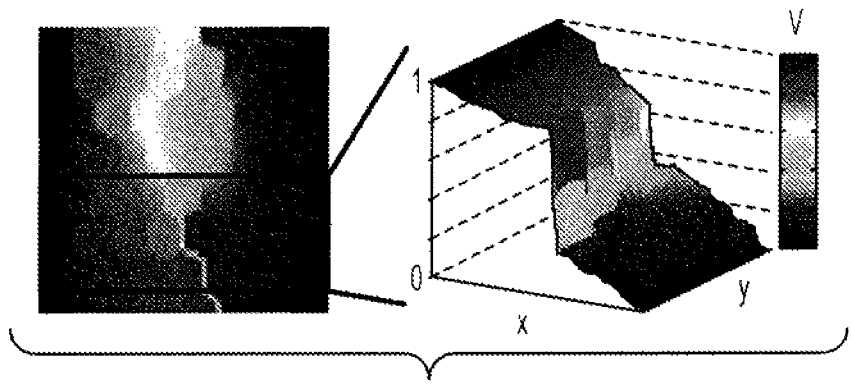
FIG. 8C illustrates a potential profile of the poly-graphene sample of FIG. 8A.
Figure 8D:
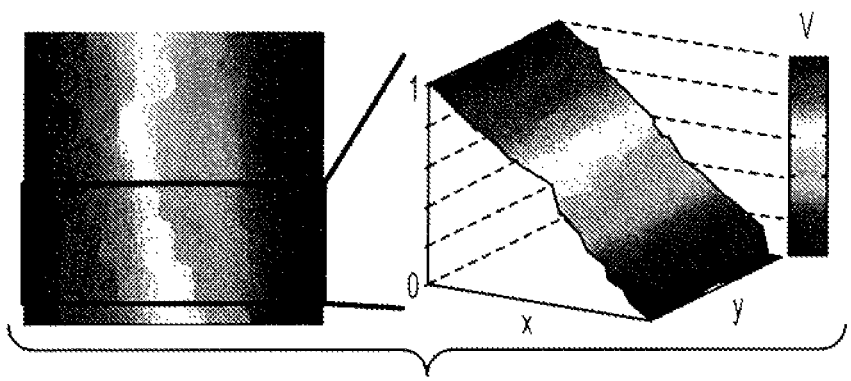
FIG. 8D illustrates a potential profile of the poly-graphene sample of FIG. 8B.

FIG. 8A-D illustrate the effect of percolation doping with metallic NWs on the potential profile of a poly-graphene sample with $P_{GB} \approx 35\%$. A sample of pure poly-graphene is illustrated in FIG. 8A, while its corresponding potential profile is shown in FIG. 8C. As can be seen in FIG. 8C, a sharp potential drop is observed at the high-resistance GBs for the pure poly-graphene sample. The same sample of poly-graphene, now percolation doped with metallic NWs, is illustrated in FIG. 8B, while its corresponding potential profile is shown in FIG. 8D. It will be appreciated that the density of metallic NWs is sparse enough not to form a continuous percolating path between electrical contacts. As can be seen in FIG. 8D, the impact of high-resistance GBs on the potential profile is significantly suppressed in the hybrid TCM. This occurs because the metallic NWs provide low-resistance paths to bypass high-resistance GBs.

Figure 8E:
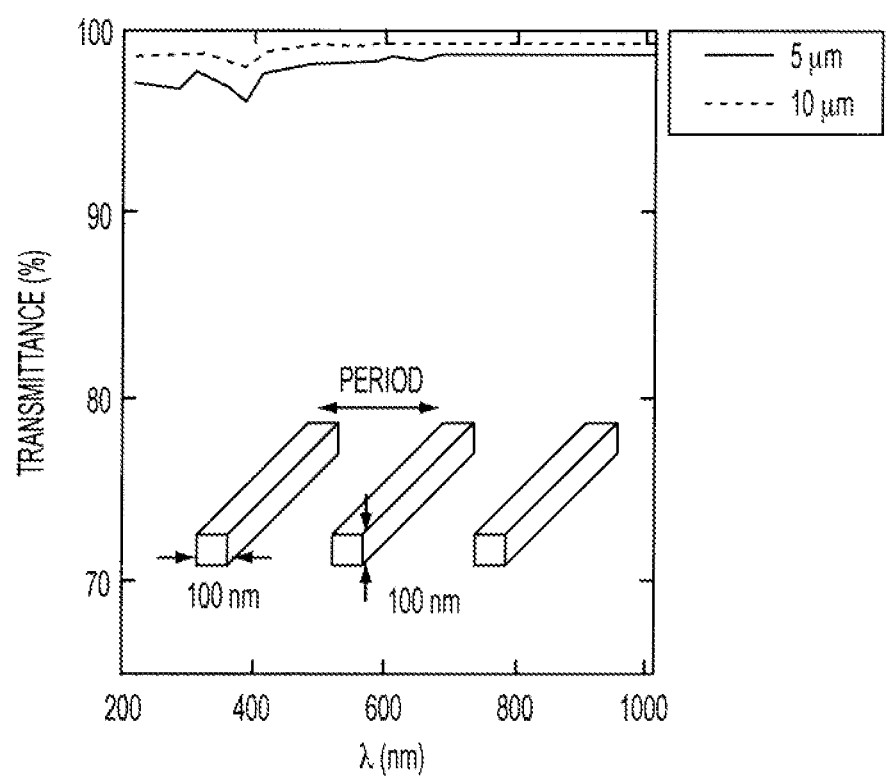
FIG. 8E is a graph of simulated transmittance as a function of incident light wavelength for a regularized network of NWs for two different NW densities.

The transmittance of the hybrid TCM described above may be calculated by solving Maxwell's equations with Floquet periodic boundary conditions. Normal illumination was assumed and the transmittance of both transverse electric and transverse magnetic modes were calculated for a set of wavelengths spanning the entire solar spectrum. For computational simplicity, the random dispersion or metallic NWs was approximated using a regularized network (i.e., identical spacing and dimensions for the metallic NWs. as shown in FIG. 8B). The simulated transmittance as a function of incident wavelength for regularized networks of NWs with a line width of 100 nm, a height of 100 nm, and a period of either 5 μm or 10 μm (corresponding to a NW density, $\rho_{NW}$, of either 100% or 50%, respectively) is plotted in FIG. 8E. The average transmittance (of the TE and TM modes) may exceed 99%, i.e., $T_{Ag}$>0.99. As the transmittance of monolayer poly-graphene is close to 97.7% as well, a hybrid TCM should achieve T=$T_{graphene} \times T_{Ag} \approx 0.96$. As shown in FIG. 9, even with 2-3 layers of hybrid TCM. T=$(T_{graphene} \times T_{Ag})^n$>0.90 may be obtained.

Figure 9:
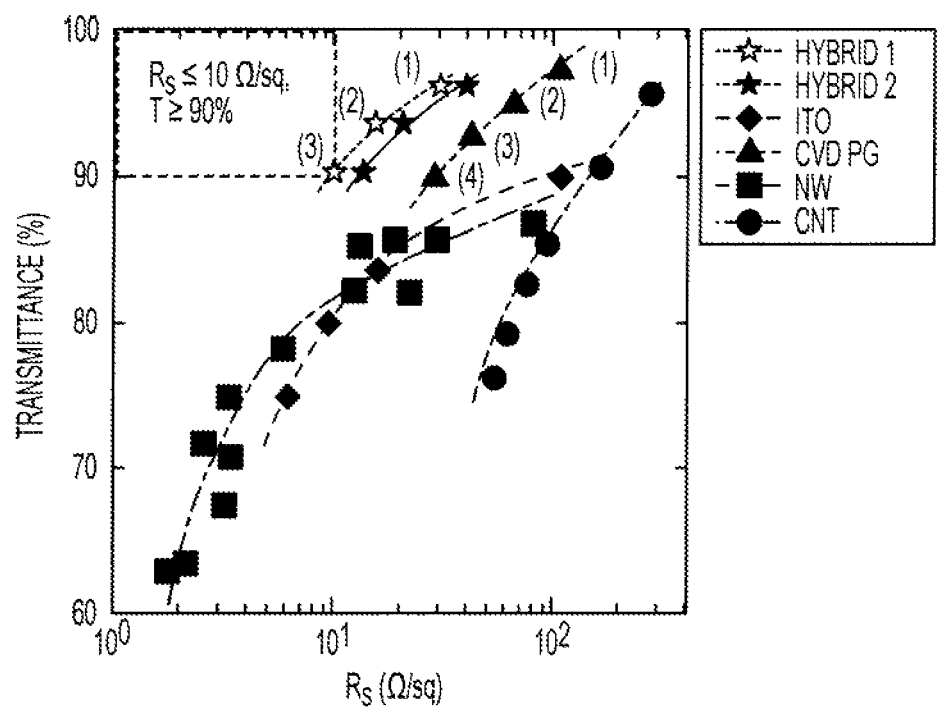
FIG. 9 is a graph of transmittance as a function of sheet resistance for illustrative embodiments of the presently disclosed hybrid TCMs as well as various conventional TCMs.

Transmittance, T, as a function of sheet resistance, $R_S$, for illustrative embodiments of the presently disclosed hybrid TCMs is plotted in FIG. 9. The numerals in brackets denote the transmittance and sheet resistance that may be achieved using 1, 2, and 3 layers of the hybrid TCMs. These values were computed as described above, using the following parameters: Rs for single crystalline graphene of 30Ω/□, ratio for inter-grain resistance to intra-grain resistance of ~63, $P_{GB}$ of 35%, and geometric aperture of 99% for the dispersion of metallic Ag NWs. As can be seen in FIG. 9, the presently disclosed hybrid TCM may achieve both low sheet resistance (e.g., $R_S$<10Ω/□) and high transmittance (e.g., T>90%). Transmittance, T, as a function of sheet resistance, $R_S$, for various conventional TCMs, including ITO, CVD poly-graphene, networks of NWs, and networks of CNTs, is also plotted in FIG. 9 for comparison. As will be appreciated by those of skill in the art, the presently disclosed hybrid TCMs surpass the transparency-conductivity limitations of pure poly-graphene films or pure CNT/NW networks.

In addition to significant improvement in transmittance and sheet resistance values, the presently disclosed hybrid TCMs also exhibit reduced statistical variation in sheet resistance, as compared to pure poly-graphene films. The inset of FIG. 7 shows the normalized standard deviation ("NSD") computed for pure poly-graphene and the hybrid TCMs with $R_C \approx 200$ Ω·μm and $R_C \approx 20$ Ω·μm as a function of the percentage of high-resistance GBs, $P_{GB}$. For pure poly-graphene, the maximum NSD is about 0.15, meaning that the sheet resistance will exhibit about 15% variation among samples. The inset of FIG. 7 shows that NSD values for the hybrid TCM with $R_C \approx 200$ Ω·μm are significantly improved. For $P_{GB} \approx 35\%$. a four-fold reduction in NSD is achieved. Thus, percolation doping of poly-graphene with metallic NWs may also suppress variation in sheet resistances.

Example 1

Figure 10:
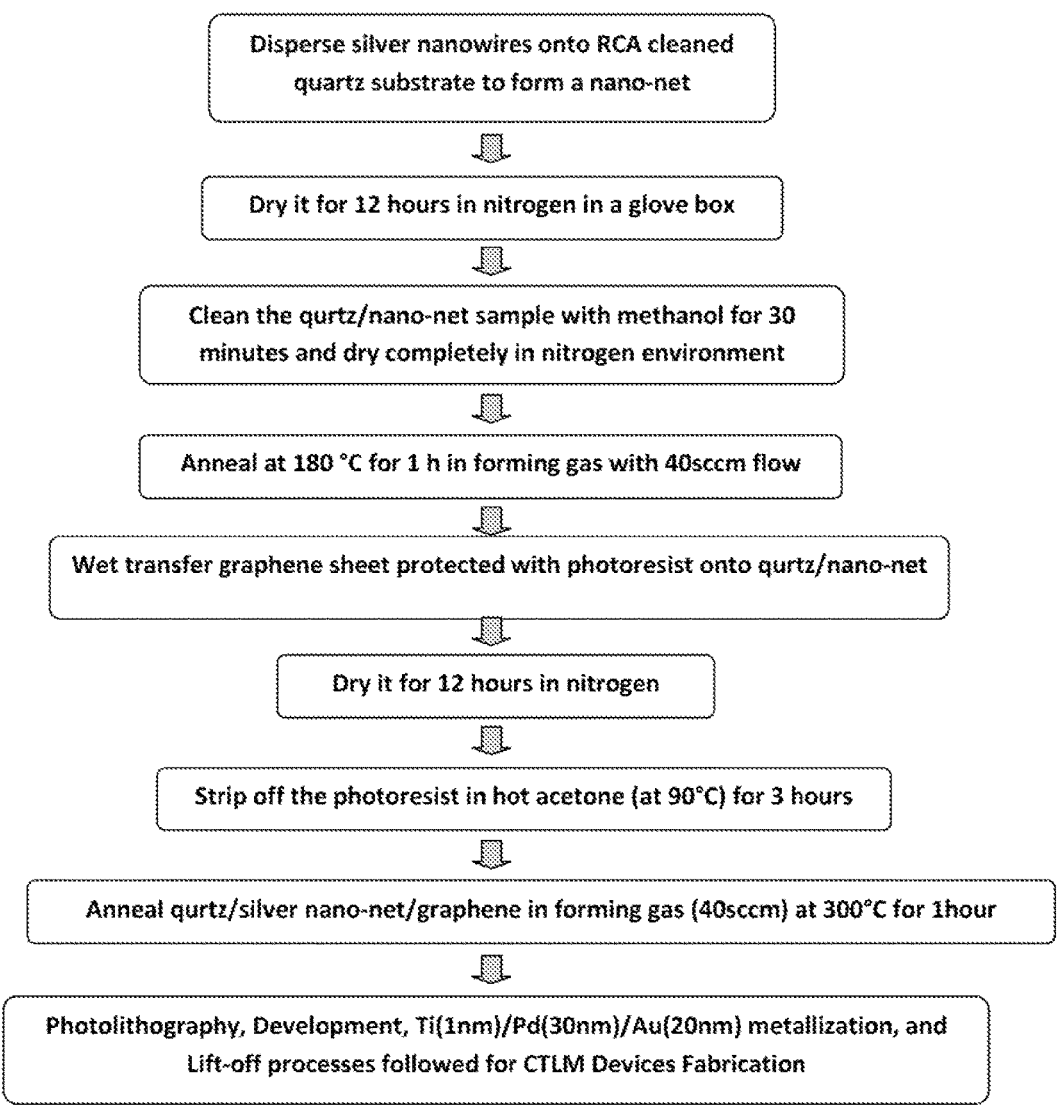
FIG. 10 is a flow chart of the manufacturing method for TCM according to the invention.
Figure 11A:
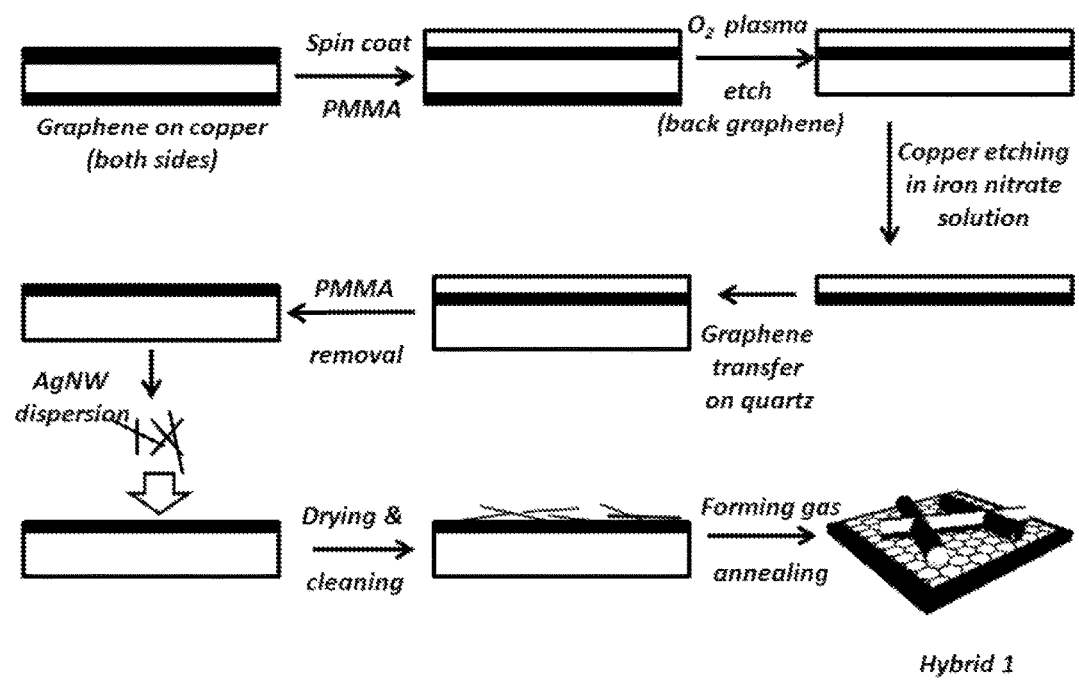
FIG. 11a shows SLG transfer process of CVD graphene grown on copper and the fabrication process flow of hybrid films (Hybrid 1).
Figure 11B:
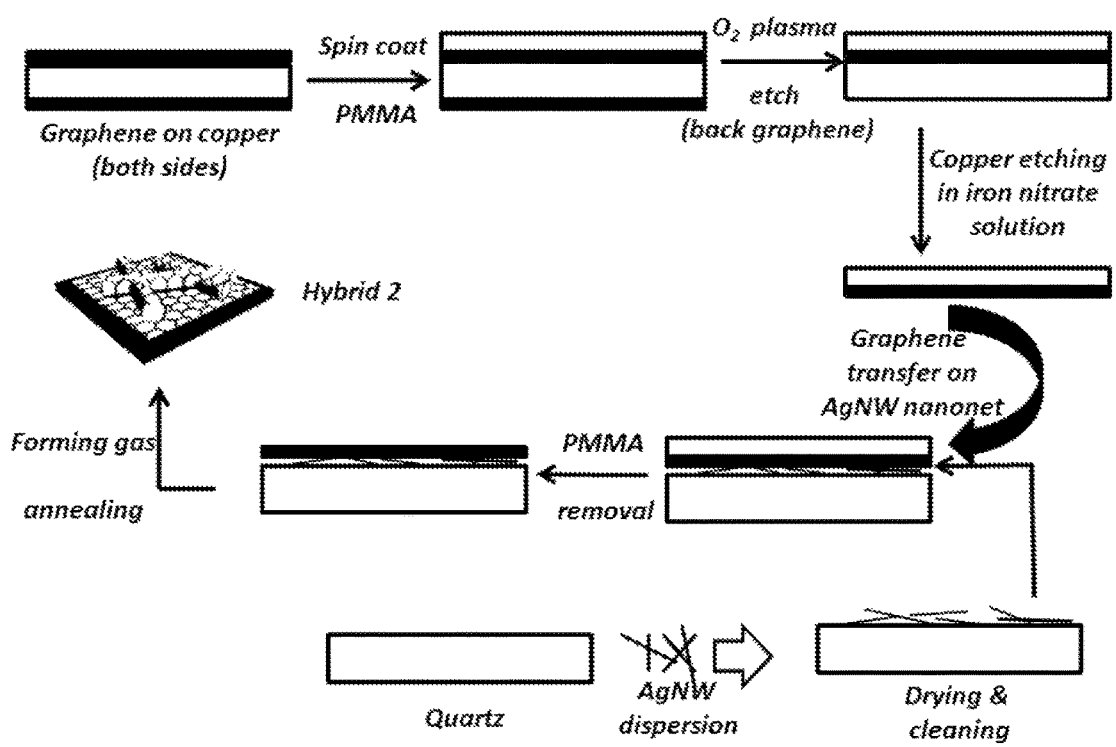
FIG. 11b shows SLG transfer process of CVD graphene grown on copper and the fabrication process flow of hybrid films (Hybrid 2).

Commercial CVD SLG on copper foil (ACS Materials Co., MA) was employed. Standard procedures were followed for plasma etching of SLG from back side of Cu and layer transfer onto a 1 cm×1 cm quartz substrate (SPI Supplies, PA), including copper etching using iron nitrate solution (X. Li, et at, *Science* (2009), 324, 1312). Commercial AgNWs (Blue Nano Inc., NC), with diameters of 70-110 nm and lengths of 20-60 μm, are dispersed in isopropyl alcohol at a concentration of 0.1 mg mL$^{-1}$. AgNW networks were drop cast either after (Hybrid 1) or before (Hybrid 2) SLG transfer, with density controlled by number of drops. Finally, the hybrid films were annealed for 1 hour in forming gas at 300° C. with a 40 sccm flow rate. The schematic process flow of SLG transfer and fabrication of hybrid films is shown in FIGS. 10, 11a and 11b. SLG and Hybrid 2 films were also fabricated on transparent, flexible PET substrates (from Dupont) for mechanical bending tests.

Raman spectra and Raman spatial mapping were performed using a Raman spectrometer (Horiba Jobin Yvon Model Xplora with a confocal microscope and motorized sample stage) in a back-scattered geometry with a CCD detector and 532 nm excitation source. The laser spot size was ≈0.6 μm with a 100× objective lens with numerical aperture (NA) of 0.9. Using a pixel size of 0.2 μm×0.2 μm, multiple 6 μm×6 μm regions were mapped. The spectral resolution was 2.5 cm$^{-1}$ (corresponding to grating with 1200 grooves per mm), and each spectrum was averaged over three acquisitions of 5 s each. The spectra were baseline corrected and fitted with Lorentzian line shape for evaluating peak intensities and positions. FESEM images were taken in secondary electron mode using a Hitachi S4800, with accelerating voltage below 1 kV to minimize electron beam-induced damage. TEM images were taken using a FEI Titan environmental HRTEM at an accelerating voltage of 80-100 kV, and can be found in Supporting Information, Figure S2 of Chen et al. Selected area electron diffraction (SAED) patterns were extracted from fast Fourier transform (FFT) analysis using the Image J software. DF-TEM images were taken at 80 kV, with the electron beam blocked by a 30 μm objective aperture filter around each of the equivalent diffraction peaks. A procedure comparable to that recently reported for highlighting grains using DF-TEM was employed.

Example 2

CTLM electrode with channel lengths of ≈7, 22, 49 and 100 μm were fabricated by evaporation of Ti/Pd/Au (thickness 1 nm/30 nm/20 nm) in a Kurt J. Lesker electronbeam evaporator with base pressure of ≈9×10$^{-7}$ Torr, followed by lift-off. Two-terminal current vs. voltage measurements were performed using a probe station (Cascade Microtech.), Keithley 7174A switch matrix system, and a Keithley 4200 SCS semiconductor parameter analyzer. Sheet resistances were measured using CTLM, with geometry correction before sheet resistance calculation. Results can be found in Supporting Information, Figure S3 of Chen et al.

Testing and Results

Specular and Diffusive Transmittance:

Since the surfaces of the hybrid films are textured, it is important to characterize their diffusive and specular transmittances. The diffusive spectra for the (i) quartz substrate, (ii) quartz with SLG, and (iii) the quartz with hybrid films were all measured at normal incidence using a Perkin Elmer (lambda 950) UV/VIS/NIR spectrophotometer. The instrument was first calibrated with standard spectralon plate reference corresponding to 100% transmittance, and the measurements were made in 300-1200 nm wavelength range with data taken at each 5 nm interval. The specular measurements were made using a Cary 5G UV/VIS/NIR spectrophotometer over the same wavelength range at normal incidence, and are shown in Supporting Information, Section S5, Figure S7 of Chen et al. As expected, the difference between both transmittance increases with nanowire density.

Optical Simulation for AgNWs:

A 2D approximation of the AgNWs structure (without SLG) was used to model (by solving the 3D Maxwell's equations numerically) the optical response of the AgNWs nanonet structure used in Hybrid 1 and Hybrid 2. Numerical study using COMSOL RF-module and MATLAB were used for both transverse electric (TE) and transverse magnetic (TM) waves, and is reported in Supporting Information, Section S6, of Chen et al.

Mechanical Stress and Chemical Stability:

Mechanical pressure was applied on the devices with AgNWs, as well as the devices with hybrid films by pressing the CTLM devices. Electrical measurements were performed just after applying the pressure. The chemical stability of the hybrid samples were assessed by storing the devices over four months in nitrogen-filled glove-box, then exposing the devices to normal atmospheric condition for 4-5 days, and finally, measuring the sheet resistance at the end of the period. The details of the measurement results are given in Supporting Information, Section S7, of Chen et al. For the mechanical bending test, the SLG and Hybrid 2 films were wrapped over the surfaces of half-cylindrical forms of radii 14.6 mm, 11.5 mm, and 8.3 mm respectively and the CTLM devices with channel length of 100 μm were electrically probed. See Supporting Information, Section S8, of Chen et al.

In this co-percolating system, the transport bottleneck of one component (e.g., AgNW) is circumvented by the transport channels of the other (e.g., graphene) and vice versa. Although $R_S$ of Hybrid 1 and 2 can both be understood by co-percolating transport, the lower $R_S$ in Hybrid 2 is attributed to the more intimate contact (and therefore, reduced $R_{Gr-NW}$ and $R_{NW-NW}$) associated with the wrapping of the SLG over the NWs. Furthermore, when graphene covers the nanowires it acts as a protective blanket to protect the nanowires from the environment. Therefore Hybrid 2 is the preferred structure. The spontaneous wrapping of graphene over metallic nanoparticle surface (in this case, AgNWs) is energetically favored.

High performance TCEs consisting of hybrid assemblies of graphene and silver nanowire networks of varying densities were obtained. $R_S$ of 22Ω/☐ was obtained in the hybrid films at 88% optical transparency (stabilized to 13Ω/☐ after four months), with excellent stability upon atmospheric exposure, mechanical pressure and mechanical bending. These TCE properties are better than commercially-available ITO, and comparable to the best reported results in TCEs.

The transparent conducting materials according to the invention can be used as transparent conducting electrodes having high transparency and low sheet resistance for applications in the manufacture of photovoltaics, photodetectors, flat panel displays, touch screen devices and imagers. For example, a photovoltaic cell can comprise a transparent electrode of polycrystalline graphene that is percolation doped with metallic nanowires, or a liquid crystal display may comprise a transparent electrode of polycrystalline graphene that is percolation doped with metallic nanowires.

While certain illustrative embodiments have been described in detail in the drawings and the foregoing description, such an illustration and description is to be considered as exemplary and not restrictive in character, it being understood that only illustrative embodiments have been shown and described and that all changes and modifications that come within the spirit of the disclosure are desired to be protected. A plurality of advantages of the present disclosure arises from the various features of the methods, apparatus, manufactures, and compositions described herein. It will be noted that alternative embodiments of the methods, apparatus, manufactures, and compositions of the present disclosure may not include all of the features described, yet still benefit from at least some of the advantages of such features. Those of ordinary skill in the art may readily devise their own implementations of methods, apparatus, manufactures, and compositions that incorporate one or more of the features of the present invention and fall within the spirit and scope of the present claims.

Thus, a hybrid transparent conducting material has been described according to the present invention. Many modifications and variations may be made to the techniques and structures described and illustrated herein without departing from the spirit and scope of the invention. Accordingly, it should be understood that the materials and methods described herein are illustrative only and are not limiting upon the scope of the invention.

What is claimed is:

1. A hybrid transparent conducting material (TCM) comprising:
    a granular polycrystalline film and
    a layer, on the granular polycrystalline film, comprising a plurality of randomly dispersed conductive nanostructures comprising nanowires.

2. The hybrid TCM of claim 1, wherein the granular polycrystalline film is an atomic monolayer.

3. The hybrid TCM of claim 1, wherein the granular polycrystalline film is a polycrystalline graphene film.

4. The hybrid TCM of claim 1, wherein the conductive nanostructures are metallic nanowires.

5. The hybrid TCM of claim 4, wherein the metallic nanowires are silver nanowires.

6. The hybrid TCM of claim 1, wherein each of the conductive nanostructures has a length greater than 1 µm and a cross-sectional dimension of less than 1 µm.

7. The hybrid TCM of claim 1, wherein density of the plurality of conductive nanostructures randomly dispersed in the granular polycrystalline film is below a percolation threshold.

8. The hybrid TCM of claim 1, wherein density of the plurality of conductive nanostructures randomly dispersed on the polycrystalline film is at most sixty percent of the percolation threshold.

9. The hybrid TCM of claim 1, wherein average distance between the conductive nanostructures is greater than average length of the conductive nanostructures.

10. The hybrid TCM of claim 1, wherein the granular polycrystalline film and the nanowire layer separately each have a sheet resistance of 20 ohms per square or greater.

11. The hybrid TCM of claim 10, wherein the hybrid TCM has a sheet resistance below twenty ohms per square.

12. The hybrid TCM of claim 11, having a transmittance above ninety percent for solar radiation.

13. A hybrid transparent conducting material (TCM) comprising:
    a granular polycrystalline film; and
    a layer, on the granular polycrystalline film, comprising a plurality of randomly dispersed conductive nanostructures;
    wherein an average length of the conductive nanostructures is greater than an average grain diameter in the granular polycrystalline film.

14. A hybrid transparent conducting material (TCM) comprising:
    a granular polycrystalline film; and
    a layer, on the granular polycrystalline film, comprising a plurality of randomly dispersed conductive nanostructures;
    wherein the number of conductive nanostructures is less than one half the number of grains in the granular polycrystalline film.

* * * * *